United States Patent
Six et al.

(10) Patent No.: US 9,460,564 B2
(45) Date of Patent: Oct. 4, 2016

(54) DETECTING THE PASSING BETWEEN A TRANSMITTER AND A DETECTOR

(75) Inventors: Mark Six, Heemskerk (NL); Marcel Schaap, Santpoort Zuid (NL)

(73) Assignee: MYLAPS B.V., Haarlen (NL)

( * ) Notice: Subject to any disclaimer, the term of this patent is extended or adjusted under 35 U.S.C. 154(b) by 370 days.

(21) Appl. No.: 13/267,915

(22) Filed: Oct. 7, 2011

(65) Prior Publication Data
US 2012/0087421 A1   Apr. 12, 2012

(30) Foreign Application Priority Data

Oct. 7, 2010   (EP) .................................... 10186866

(51) Int. Cl.
| | |
|---|---|
| H03D 3/24 | (2006.01) |
| G01S 13/08 | (2006.01) |
| H03L 7/06 | (2006.01) |
| G07C 1/24 | (2006.01) |
| H03L 7/081 | (2006.01) |

(52) U.S. Cl.
CPC .............. *G07C 1/24* (2013.01); *H03L 7/0814* (2013.01)

(58) Field of Classification Search
CPC ............ G07C 1/24; G07C 1/22; G07C 1/20; G07C 5/085
USPC .................. 375/373; 342/118, 125
See application file for complete search history.

(56) References Cited

U.S. PATENT DOCUMENTS

| | | | |
|---|---|---|---|
| 5,091,895 A * | 2/1992 | Chatwin et al. ................... 368/6 |
| 5,594,448 A | 1/1997 | D Hont | |
| 6,993,108 B1 * | 1/2006 | Chi ........................ H03L 7/0814 |
| | | | 375/374 |
| 7,184,511 B2 * | 2/2007 | Younis ................. H03D 13/003 |
| | | | 327/157 |
| 2003/0123591 A1 * | 7/2003 | Walker ..................... H03L 7/081 |
| | | | 375/355 |
| 2004/0032363 A1 * | 2/2004 | Schantz ............... H04B 5/0075 |
| | | | 342/127 |
| 2004/0141577 A1 * | 7/2004 | Brunn .................. H03D 13/003 |
| | | | 375/376 |
| 2005/0046608 A1 * | 3/2005 | Schantz ............... H04B 5/0075 |
| | | | 342/127 |
| 2006/0267833 A1 * | 11/2006 | Langford .............. G01S 5/0252 |
| | | | 342/174 |
| 2010/0013711 A1 * | 1/2010 | Bartlett ......................... 342/442 |
| 2010/0141454 A1 | 6/2010 | Bantin | |

FOREIGN PATENT DOCUMENTS

| | | |
|---|---|---|
| EP | 0834748 | 4/1998 |
| WO | 0114905 | 3/2001 |

OTHER PUBLICATIONS

European Search Report, mailed Feb. 2, 2011 in connection with European Patent Application No. 10186866.9.
Extended European Search Report, mailed Dec. 23, 2011 in connection with European Patent Application No. 11184385.0.
Communication Pursuant to Article 94(3) EPC, for corresponding foreign application 11184385.0-1558, dated Jun. 24, 2014.

* cited by examiner

*Primary Examiner* — Daniel Washburn
*Assistant Examiner* — Sarah Hassan
(74) *Attorney, Agent, or Firm* — Steven M. Koehler; Westman, Champlin & Koehler, P.A.

(57) ABSTRACT

Method and a system for detecting the passing between a transmitter module and a detecting module is described. The method may comprise: detecting a plurality of signals transmitted by said transmitter module; determining phase information associated with at least a part of said plurality of detected signals; and, determining said passing on the basis of said phase information.

15 Claims, 9 Drawing Sheets

DETECTING THE PASSING BETWEEN A TRANSMITTER AND A DETECTOR

CROSS-REFERENCE AND PRIORITY CLAIM TO RELATED APPLICATIONS

This application claims priority to European Patent Application No. EP10186866.9, filed Oct. 7, 2010, which application is incorporated herein by reference and made a part hereof in its entirety.

FIELD OF THE INVENTION

The invention relates to detecting the passing between a transmitter and a detector, and, in particular, though not exclusively, to a methods and a system for detecting on the passing between a transmitter module and a detection module, a detector module and a transponder for use in such system and a computer program product using such method.

BACKGROUND OF THE INVENTION

Sports events such as car- or motor racing, athletics and ice-skating, typically require accurate and fast time registration for tracking the participants during the event. Such a timing system is usually based one a transmitter-detector based scheme, wherein each participant in the event is provided with a transmitter. The transmitter may be configured to transmit packets at a certain frequency and to insert a unique identifier into the packet such that a detector is able to associate a packet with a certain transmitter.

Each time a transmitter passes or crosses an antenna of the detector, the detector may receive multiple data packets associated with the transmitter. The signal strength associated with a received data packet is a function of distance of the transmitter relative to the antenna and the particular configuration of the transmitter- and detector antennae. Hence, by assigning time-stamp information and by evaluating the signal strength associated with each data packet, the detector may determine at what time the transponder passes the detector antenna.

An example of such conventional timing system is described in U.S. Pat. No. 5,091,895. Determining the passing of a transmitter by evaluating the signal strength however has some disadvantages. In such timing system only a limited number of data packets and an equally limited number of signal strength data are available for determining the passing time. Therefore, data processing algorithms may be used in order to determine the passing time. Selection of the data used in the data processing algorithms however may influence the outcome and possibly negatively influence the accuracy of the result.

Moreover, the use of data processing algorithms may impose serious constraints in terms of processing time. In a conventional system, a complete data set of a passing transponder is needed before a data processing algorithm is able to process them thereby introducing a time delay before the detector is able to produce a passing time. This poses problems in real-time applications as the passing time is determined long after e.g. a vehicle or a skater has passed the finish line.

The problems associated with conventional systems, in particular accuracy and processing time problems associated with conventional systems, are of particular importance when the timing system is used in conjunction with video or television system. In such situations it is desirable to have a system, which is capable of accurately and quickly determining multiple passings of transponders.

Hence, there is a need in the prior art for improved timing methods and systems. In particular, there is a need in the art for the detection of a moving transmitter passing or crossing a detector antenna with increased accuracy thereby allowing fast and efficient data processing so that such timing systems are suitable for real-time applications. Moreover, there is a need in the art for detection of a detector passing or crossing a transmitter antenna allowing the detector to generate an accurate trigger signal upon passing the antenna.

SUMMARY OF THE INVENTION

It is an object of the invention to reduce or eliminate at least one of the drawbacks known in the prior art. In a first aspect the invention may relate to a method for detecting the passing between a transmitter module and a detection module, wherein the method may comprise: detecting a plurality of signals transmitted by said transmitter module; determining phase information associated with at least a part of said plurality of detected signals; and, determining the passing of said transmitter module on the basis of said phase information. The phase of the detected signal may provide a very simple and fast way for accurately determining the passing of a transmitter module passing an antenna associated with receiver. The passing may be detected by simply monitoring the phase information in time and detecting a discontinuous phase transition from a first phase value to a second phase value. The passing coincides with transmitter passing the antenna of a detector. The phase transition is a very sharp and distinct signal thus allowing accurate determination of a passing time.

The invention may be used for accurately determining the passing time associated with a transmitter module passing a (fixed) detection module. In this way, the phase information may enable real-time processing of the timing information so that the timing information may be used in conjunction with fast video-processing techniques. Alternatively and/or in addition, the invention may be used for generating an accurate trigger signal in a detector module passing a (fixed) transmitter module.

In one embodiment, the method may comprise: detecting at least one phase transition in said phase information; and, associating said at least one phase transition with said passing. It has been found that when passing an antenna, the phase of the detected transmitter module signal may undergo a sharp phase transition. As the phase transition is a very sharp and well defined, this transition may be used by a detection module an accurate indicator for a passing transmitter module.

In another embodiment, the method may comprise: associating timing information to at least a part of said detected signals; determining a passing time on the basis of said timing information and said phase information. By assigning a time to the measured phase signals an accurate passing time may be determined by evaluating the time information associated with data points in the vicinity of the phase transition.

In one embodiment, the method may further comprise: determining signal strength information associated with at least part of said detected signals; detecting a phase transition in said phase information; determining first timing information on the basis of said signal strength information associated with a first set of detected signals measured before said first phase transition. In another embodiment, the method may comprise: executing a first algorithm for determining said first timing information when said phase transition is detected. In yet another embodiment, the method may comprise determining second timing information on the basis of said signal strength information associated with a second set of detected signals measured after said first phase transition. This way, using a sharp transition in the phase signal, distinct data set may be determined for processing.

In one variant said signals may be transmitted using a modulation technique, preferably quadrature amplitude modulation or a phase shift keying technique, said method comprising: determining at least an in-phase component I and quadrature component Q associated with a detected signal; determining a detected signal phase on the basis of said I and Q components. Using the I and Q components of the detected signal a signal phase may be easily determined.

In another variant, at least part of said transmitted signals may be associated with a predetermined phase.

In yet another variant said passing may relate to said transmitter passing the centre-line of an antenna loop associated with said detector.

In another aspect, the invention may relate to a detection module for detecting the passing of a transmitter module wherein the module may comprise: a receiver connected to an antenna for receiver a plurality of signals transmitted by said transmitter module; a phase detection module for determining phase information associated with at least a part of said plurality of detected signals; and, a signal processor for determining said passing on the basis of said phase information.

In one embodiment said signal processor may be configured detect at least one phase transition in said phase information and to associated said at least one phase transition with said passing.

In another embodiment said detection module may further comprise a time stamp module for assigning time information, preferably detection time information, to a received signal and wherein said signal processor is configured to determine a passing time on the basis of said phase information and said time information.

In yet another embodiment, said detection module may further comprise a signal strength measuring unit for determining a signal strength associated with a received signal.

In another embodiment, said detection module may comprise a receiver which may be configured to generate at least an in-phase component I and quadrature component Q associated with a detected signal and/or wherein said phase detection module may be configured to determine a phase associated with a received signal on the basis of said I and Q components.

In a further aspect, the invention may relate to a transponder comprising a detector module as described above, wherein said transponder may further comprise a communications interface for communicating with an external vehicle controller and wherein said signal processor may be configured to transmit a timing signal to said vehicle controller if said passing is detected on the basis of said phase information.

In yet a further aspect the invention may relate to a timing system for detecting the passing between a transmitter module and a detector module, wherein said system may comprise at least one transmitter module for transmitting a plurality of signals; and, at least one detection module as described above.

The invention may also related to a computer program product, wherein the computer program product may comprise software code portions configured for, when run on a computer, executing one or more method steps as described above.

The invention will be further illustrated with reference to the attached drawings, which schematically will show embodiments according to the invention. It will be understood that the invention is not in any way restricted to these specific embodiments.

DETAILED DESCRIPTION

Figure 1B:
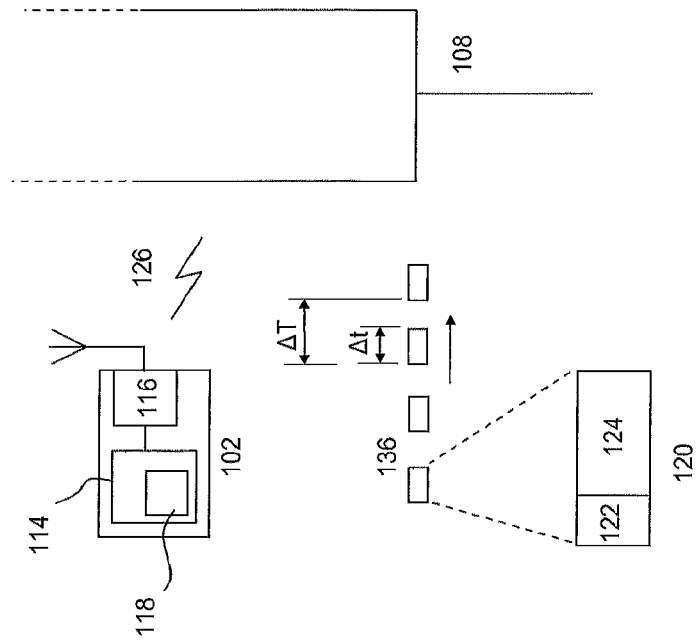
FIG. 1 depicts at least part of a timing system according to one embodiment of the invention.
Figure 1A:
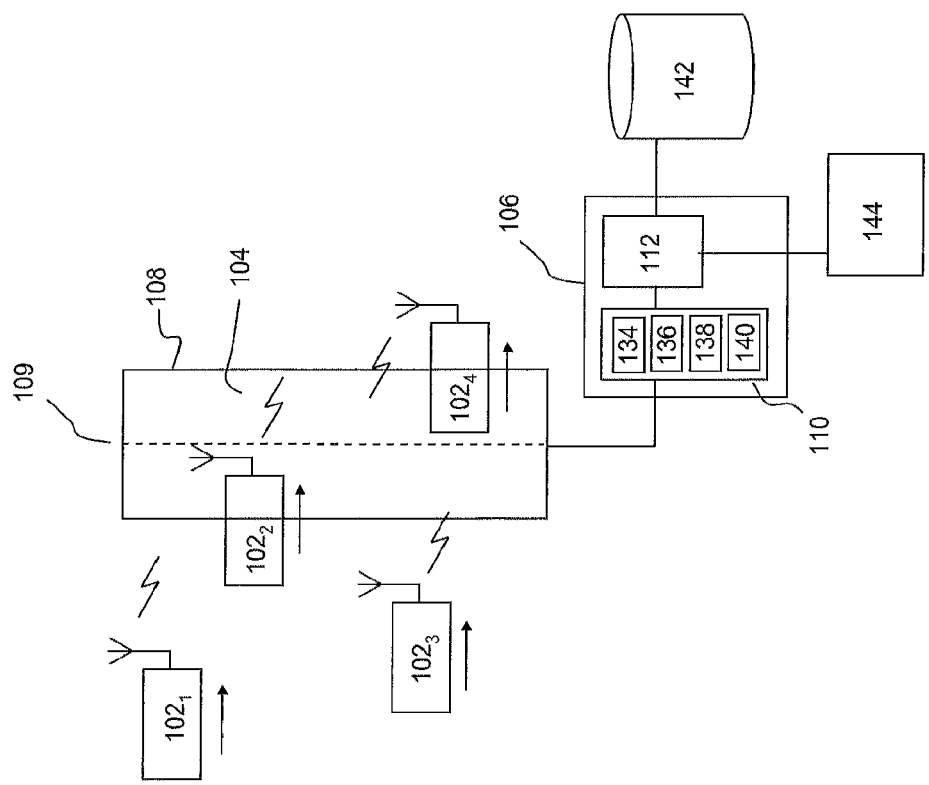

FIG. 1A depicts a timing system 100 according to one embodiment of the invention. In particular, FIG. 1A illustrates a plurality of moving transmitter modules $102_1$-$102_4$ configured to transmit a RF data signal 104 and a base station 106 associated with one or more antennae 108, typically a loop antenna, for detecting the RF data signals. If a transmitter module is within a certain distance of the base station antenna, a detection module 110 in the base station may receive the data signals and subsequently send these data signals to a processor 112 comprising a signal processing module 113 for processing information associated with the data signals such as timing information regarding the time when the transmitter module has passed the antenna and identification information for identifying the transmitter module.

FIG. 1A depicts a timing system comprising a fixed detection module configured for detecting a moving transmitter passing (crossing) a detector antenna. Such configuration may be used for time monitoring in sports events which require accurate and fast time registration, e.g. motor and car racing, athletics, ice-skating, etc. In such cases, a transmitter module may be associated with a participant in the event by attaching it to the vehicle, the skate, ski, or a shoe or any other suitable means. A centre-line 109 of the base station antenna may coincide with a time-monitoring location (e.g. a finish line or the like).

While FIG. 1A depicts a timing system comprising a fixed detection module detecting the passing of a moving transmitter, other configuration are also envisaged. For example, in one embodiment, the timing system may comprise a detection module moving with respect to a fixed transmitter module. In such configuration, the timing system may be used for generating an accurate time trigger signal. For example, the detector module may be attached to a vehicle. When passing a fixed transmitter module, the detection module may generate a trigger signal, which may be used for triggering an event in the vehicle, e.g. storing certain engine parameters or the like. In such cases, the detection module may comprise an interface for data communication with an external device, e.g. a vehicle controller or the like. In yet another embodiment, the time system may comprise a moving detection module moving relatively with respect to a moving transmitter module.

Further, depending on the type of application, the transmitter and/or detection module may be combined with other functional elements. In one embodiment for example, the transmitter and detection module may be part of a transponder. Such transponder may be configured to detect a RF antenna signal and to generate, in response to a detected antenna signal, a RF data signal for transmission to the antenna.

FIG. 1B depicts a transmitter module 102 used in a timing system in more detail. The transmitter module may comprise a processor 114 for generating a data signal and a RF data transmitter 116 for transmitting the generated data signal to a detector system. For purposes described hereunder in more detail, the phase difference between data signals sent by the transmitter module to the base station is known in advance.

The timing system may use a suitable data transmission scheme. Examples include schemes based on quadrature amplitude modulation (QAM). Further schemes include digital modulation schemes based on frequency shift keying (FSK), phase shift keying (PSK) and amplitude-shift keying. To that end, the processor in the signal-transmission device may comprise a signal modulator 118 for generating a RF data signal in accordance with the selected modulation scheme. Typical transmission periods are within the range between 1 and 10 ms. Typical RF data signal lengths are within the range between 50 and 300 µs.

In one embodiment, the processor of the transmitter module may generate data packets 120 in binary format comprising e.g. a header 122 and a pay-load 124. The header information may be used by the receiver to identify the reception of a transmitted packet. The pay-load may comprise e.g. a transmitter ID, battery status. In bi-directional transponders the payload data may contain any type of data.

When a large number of transmitter modules is used, signals associated with different modules may be received simultaneously by the base station. Such interference may prevent the detector module in the base station from detecting and processing the transmitted signals. For that reason, in one embodiment, transmitter modules may transmit the signals at varying time intervals in order to reduce the likelihood of simultaneously transmission of signals by two or more transmitters. The transmitter module may in that case use e.g. an appropriate TDMA scheme.

The packets are transformed by the modulator in an RF data signal 126, which is suitable for transmission to the antenna 108 of the base station system. The detected RF data signals are demodulated by a signal demodulator 134 in or associated with the detection module, which transforms the received RF data signals into corresponding binary data packets. The information in the data packets, e.g. header and/or payload information, may be further processed by the signal processing module 113.

The detection module may further comprise a signal strength measuring unit 136 for measuring the signal strength of a received data signal, a phase detection module 138 for detecting the phase of a detected data signal and a time-stamp module 140 using a clock for time-stamping incoming data signals. As will be explained hereunder in more detail, not only the signal strength but also the phase of a received data signal is depended on (relative) distance between the transmitter and the antenna. Data received and processed by the base station may be stored in one or more databases 142 and accessed via a user interface 144, e.g. a terminal or the like.

The signal strength dependency on the distance between the transmitter module and the base station antenna is illustrated in FIG. 2A-C, which schematically depict a transmitter module 202 passing a (fixed) planar base station antenna 204, e.g. a loop antenna embedded in a road or positioned over a road, for three different positions with respect to the detector antenna.

Figure 2:
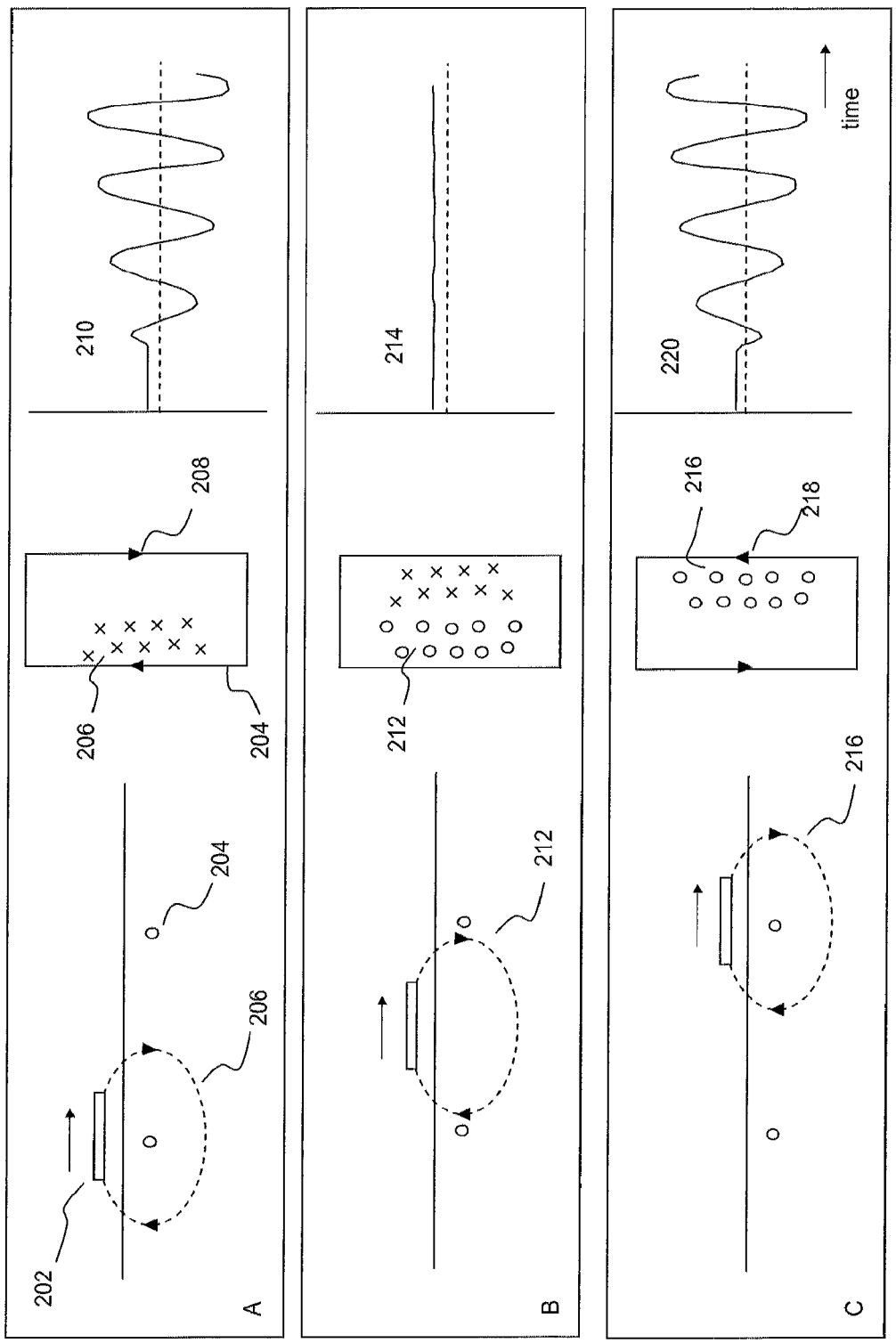
FIG. 2 schematically illustrates the coupling between a moving transmitter and a detector antenna.

The example in FIG. 2 depicts a configuration wherein the antenna planes of both antennae (receiver module and base station) lie within the x-y plane. The principle illustrated in FIG. 2 however also applies to other configurations, e.g. antenna plane of the transmitting module perpendicular to the plane of the base station antenna. FIG. 2 further illustrates for each of the three positions the part of the magnetic field responsible for inducing a signal in the loop and an example of part of a signal detected by the detection module at the particular locations.

The signal strength of a transmitted signal will depend on the electro-magnetic coupling between the transmitter module antenna and the base station antenna. When moving the transmitter module towards the base station antenna, the electromagnetic coupling—and hence the signal strength of the detected signal—will change as a function of position.

FIG. 2A depicts a side view and a top view of a first position wherein the transmitter module is located over the first part of the antenna loop of the base station. If the transmitter module transmits a signal at that position, magnetic field lines 206 associated with the signal will induce currents 208 in the antenna wherein the direction is determined by Lenz's law. As the electromagnetic coupling at this first position is relatively strong, the detection module of the base station will detect a signal 210 of relatively high signal strength.

When the transmitter module moves to a second position, i.e. the centre-line of the detector antenna loop as depicted in FIG. 2B, the coupling of the antennae is such that currents induced in the antennae loop by the magnetic fields 212 associated with the transmitted signal cancel each other out so that substantially no signal 214 is detected.

When moving away from the centre-line towards the second part of the antenna loop, again maximum coupling is achieved at a third position as indicated in FIG. 2C. If the transmitter transmits a signal at that position, again a signal of relatively high signal strength is detected. As the phase of each consecutively transmitted signal is known in advance, the coupling of the magnetic field 216 between both antennae at the third position is such that it causes the detection module to detect a signal 218, which is phase-shifted with respect to signal 220 detected at the first location (FIG. 2A) by 180 degrees.

It is submitted that the principle depicted in FIG. 2 also applies to other antennae configurations, e.g. a configuration wherein the antenna of the transmitter is perpendicular to the plane of the detector antenna. In that case, the signal strength function and the phase signal may exhibit different characteristics.

Figure 3:
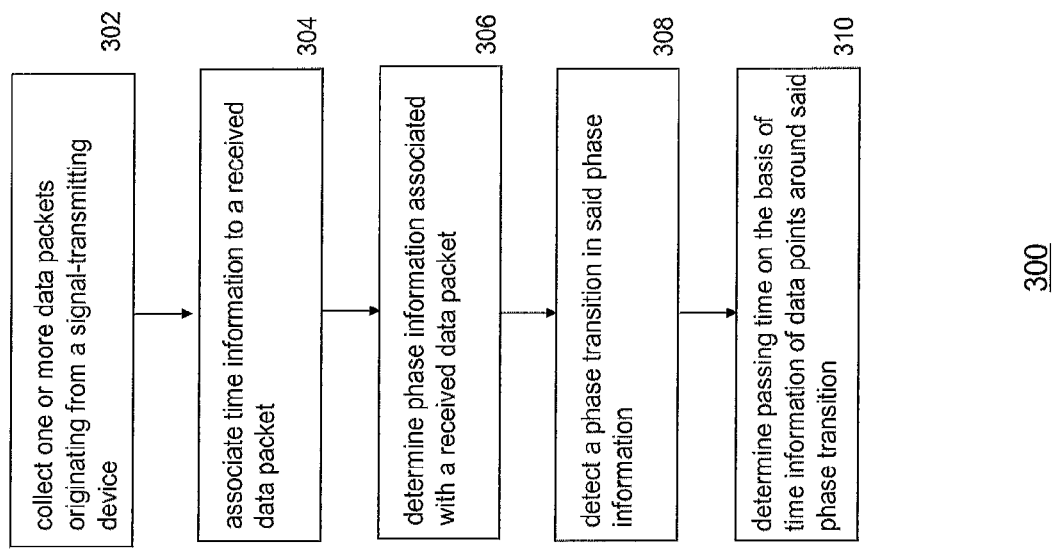
FIG. 3 depicts a flow diagram of a process for determining the passing of a transmitter according to an embodiment of the invention.

As will be explained hereunder in more detail, the detector system will use the phase transition information in the process of determining a passing time, i.e. the time at which a transmitter module crosses a centre-line of a detector antenna. A process for determining the passing of a transmitter according to one embodiment of the invention is depicted in FIG. 3.

The process may be started with the base station detecting RF signals associated with a transmitter module moving towards the base station antenna. When moving towards the base station antenna, the signal strength associated with the transmitted packets may increase and above a certain signal strength, the receiver module may start collecting data packets (step 302). During data collection, data packets may be associated with a reception time (step 304) using e.g. a time-stamping technique and phase information using the phase detecting module (step 306). Further, during data collection, the phase information is monitored for a phase transition (step 308). On the basis of the time information of data packets detected around the phase transition, the passing of a transmitter may be determined (step 310).

Figure 4:
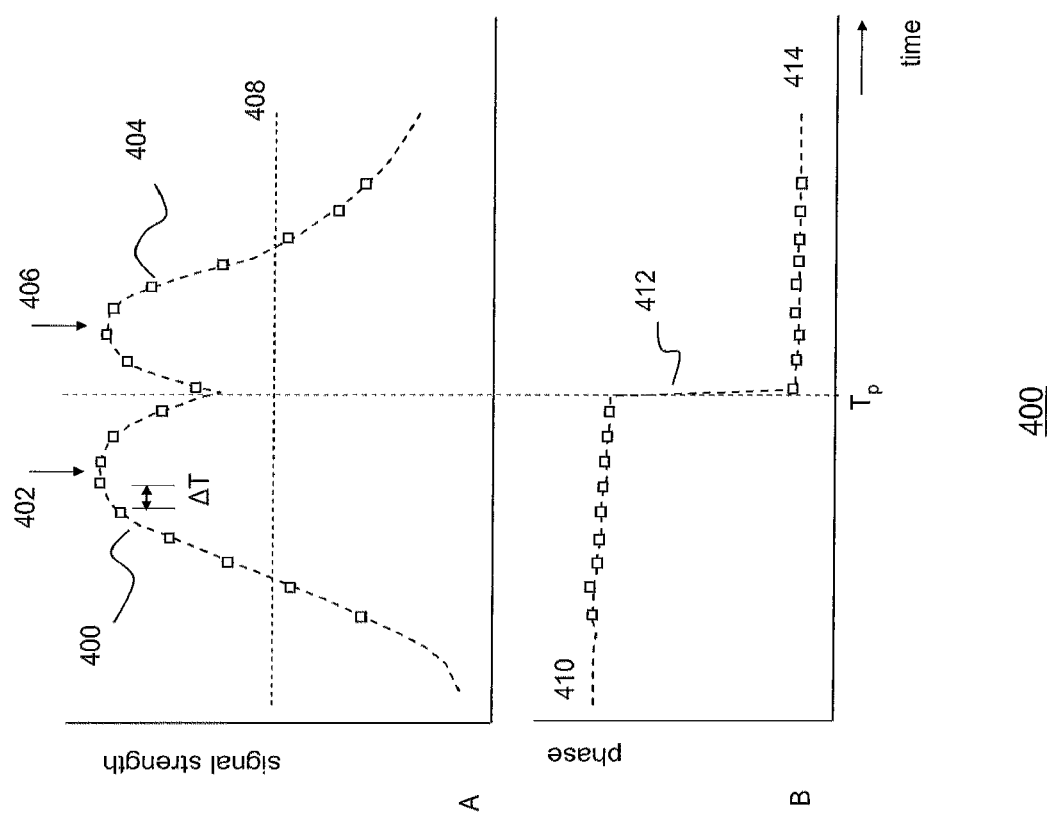
FIG. 4 depicts signal parameters measured by a detecting system according to one embodiment of the invention.

FIG. 4 depicts signal parameters measured by a detection module according to one embodiment of the invention. In particular, FIGS. 4A and 4B depict data points representing the measured signal strength and the (relative) signal phase respectively for data signals detected by the detection module as a function of time using a transmitter-detector configuration as explained with reference to FIG. 2.

The signal strength function is a substantially symmetric function around the centre-line of the loop antenna. Deviations in the parallel antennae configuration may cause deviations in the symmetry. The data points may be divided in two sets, i.e. a first set of data points 400 comprising a first maximum 402 coinciding with the situation as explained with reference to FIG. 2A and a second set of data points 404 comprising a second maximum 406 coinciding with the situation as explained with reference to FIG. 2C. A relatively sharp minimum coincides with the situation as explained with reference to FIG. 2B, i.e. the passing (crossing) of the transmitter module over the centre-line of the antenna loop of the base station.

It is remarked that FIG. 4A represents a rather ideal situation in the sense that no noise is present and every transmitted data signal is detected by the detection module. In real-life situations however, noise and/or detection errors will affect the graph of FIG. 4A so that the sharp minimum representing the passing of the transmitter module will be very difficult to determine by a signal processing algorithm in an accurate way. Hence, in conventional timing systems, the passing (crossing) of a transmitter module over the centre-line of an antenna of a detector is determined on the basis of a data set which is large enough so that a fitting algorithm may determine the first and second maximum of the signal strength function in order to derive a passing time therefrom.

FIG. 4B depicts the phase associated with the measured data points. Received data signals associated with the transmitter module moving towards the centre-line of the detector antenna loop may have an approximately constant first phase 410. Then, a relatively sharp phase transition or phase-shift 412 (in this case a 180 degree transition or shift) in the phase is observed at the point where the transmitter passes the centre-line. After the passing of the transmitter, the received data signal associated with the transmitter module moving away from the centre-line of the detector antenna loop may have an approximately constant second phase 414.

Hence, from FIG. 4B it may be observed that when monitoring the phase signal of the transmitter module traversing the centre-line of fixed detector loop, the phase signal will discontinuously change from a substantially constant first phase value to a substantially constant second phase value. Thus, in contrast with the signal strength signal, the phase information provides an accurate and sharp signal for determining the passing of a transmitter module. Once the phase change is detected, the time-stamp information associated with the phase data points around the phase transition may be used to determine the passing time Tp (i.e. the time at which the transmitter passes the centre-line of the antenna loop. Hence, the phase signal may provide a very simple and fast way for accurately determining a passing time, thereby providing a way for real-time processing of the timing information so that the timing information may be used in conjunction with fast video-processing techniques.

The accuracy for determining a passing time on the basis of the phase information is limited by the frequency at which the data signals are transmitted to the base station antenna. In one embodiment, the accuracy of the measured passing time may be improved by combining the signal strength and the phase information.

Figure 5:
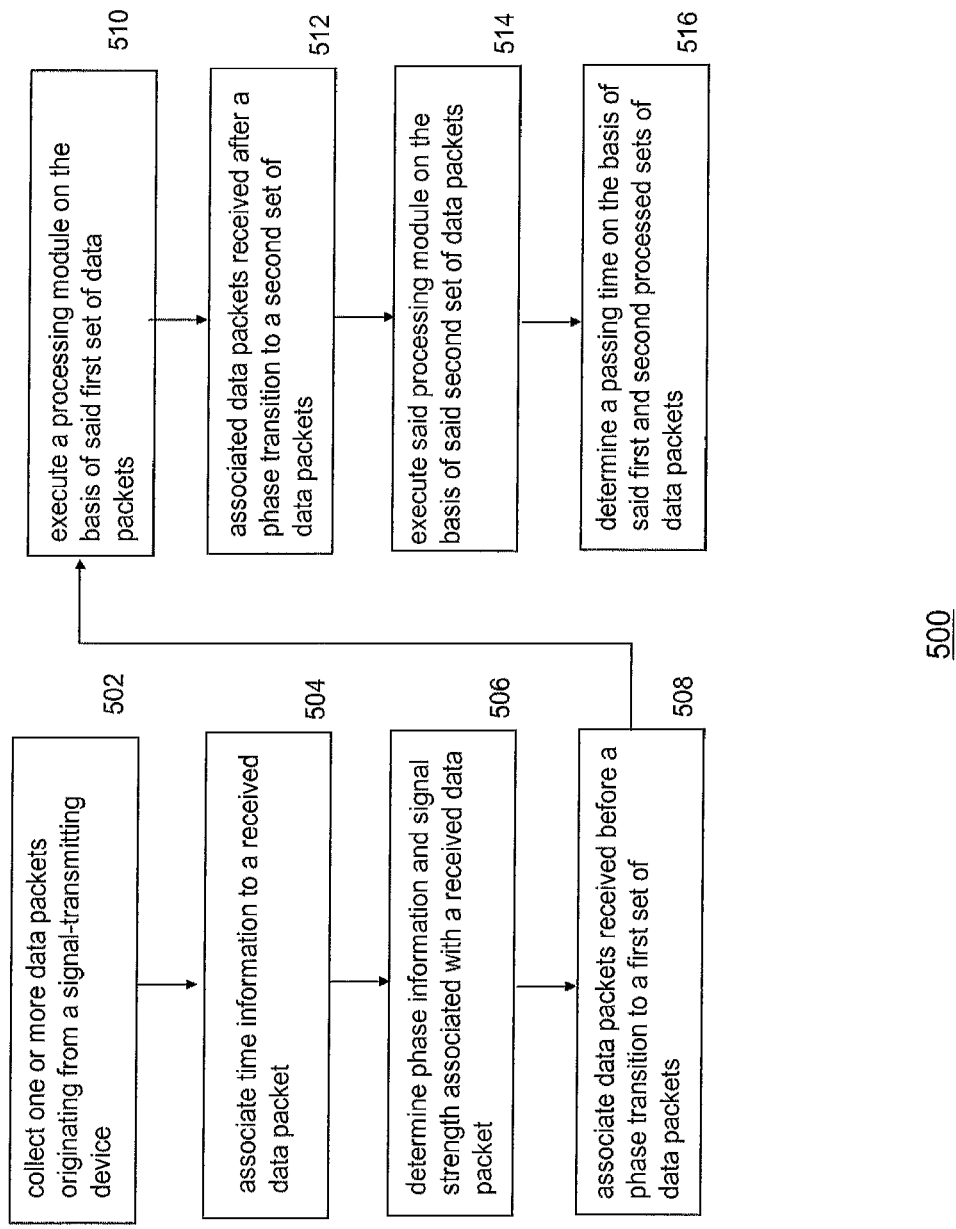
FIG. 5 depicts a flow diagram of a process for determining the passing of a transmitter according to one embodiment of the invention.

A process for determining the passing of a transmitter module according to another embodiment is depicted in FIG. 5. The process may be started with the detection module detecting RF signals associated with a transmitter module moving towards the antenna. When moving towards the receiver antenna, the signal strength associated with the transmitted packets may increase and above a certain signal strength, the receiver system may start collecting data packets (step 502). During data collection data packets may be associated with a reception time using e.g. a time-stamping technique, signal strength and phase information (step 504). During data collection, the phase information is monitored for a phase transition (step 506).

When a phase-transition in the phase signal (i.e. a discontinuous transition from a first phase value to a second phase value) is detected, the detection module may send data packets received before the phase transition to a signal-processing module (step 508) for processing the first set of data packets. The phase transition signal may be used by the detection module as a trigger to directly execute a fitting algorithm using the first data set, in particular the signal strength information associated with the first data set, as input data (step 510). This way, a first set of the data may be processed by the signal-processing module, while the rest of the data (i.e. the second set) is being collected by the detection module, thus greatly improving the data processing efficiency.

A second set of data points, detected after the phase transition, may be collected and subsequently send to the signal processing module (step 512). On the basis of the first and second data points, the signal-processing module may determine a passing time (step 514).

The sequentially detected data points may be time-stamped so that, in one embodiment, the detection module may determine on the basis of the time information associated with the first set of data points (e.g. a first time-stamp associated with the first data point and a second time-stamp associated with the last data point before the phase transition) a first detection period. The detection module may determine on the basis of this first detecting period, a second detection period for detecting data associated with a second data set. After the second detecting period, the detection module may execute a fitting algorithm in the signal-processing module using the second data set as input data.

Figure 6:
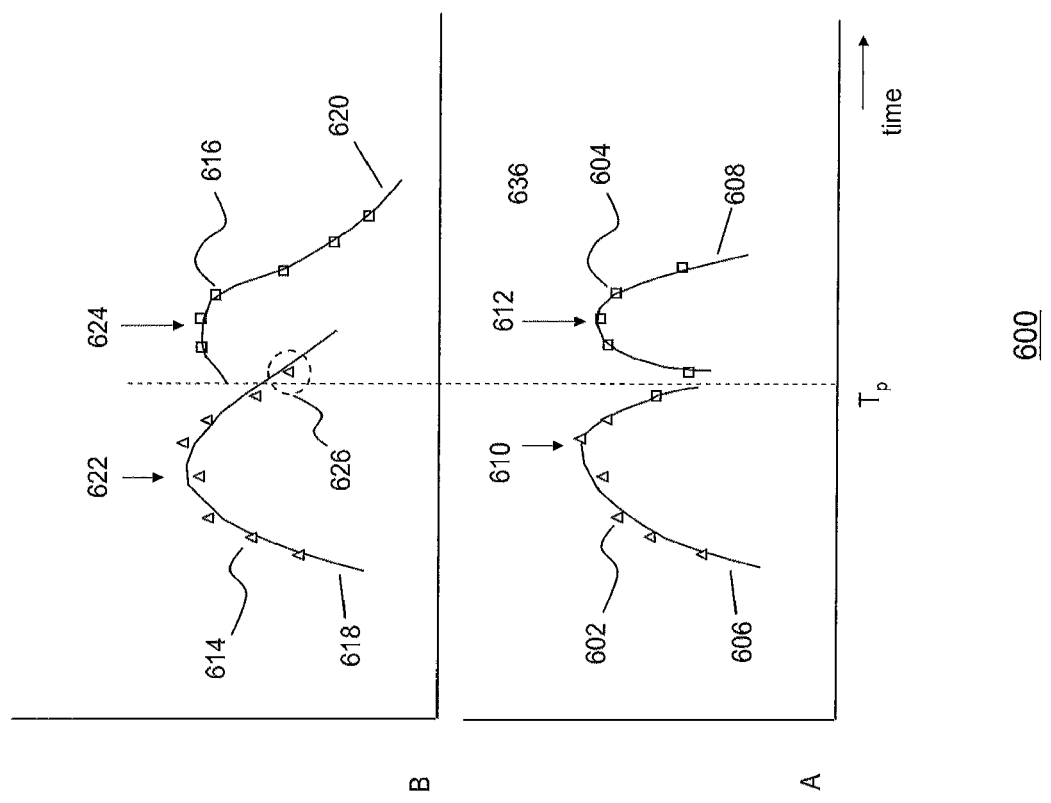
FIG. 6 depicts signal-processed data measured by a conventional detector system and a detector system according to one embodiment of the invention.

The process described with reference to FIG. 5 is illustrated in more detail in FIGS. 6A and 6B. FIG. 6A depicts the result of signal-processed data 600 using a detector system according to the invention. Signal data are measured using a detection module comprising a phase detection module for detecting the phase of the detected signal. The detection module may use the phase information in order to determine a first set of data points 602 (denoted by triangles). In one embodiment, when a time-series of data points associated with a transmitter module are detected by the detection module, it may use a transition in the phase signal (not shown) to determine that the data points measured up to the detected phase transition Tp belong to a first data set and to determine that the data points measured after the detected phase transition belong to a second data set 604 (denoted by squares).

This way, the phase information allows the base station to determine a first set of data points 602 corresponding to data measured before the transmitter passed the centre-line of the antenna loop and a second set of data points 604 corresponding to data measured after passing the centre-line of the antenna loop. A fitting algorithm in the signal-processing module may determine first and second fitting curves respectively 606,608 and on the basis of the maxima 610,612 of the fitting curves an accurate value for the passing time may be determined.

FIG. 6B depicts signal-processed data using a conventional detector system without a phase-detecting module. In such system the detection module first measures a data set, which is large enough to comprise a substantial part of the signal strength function. Thereafter, a processing module divides the data points in first and second data sets 614,616 and uses a fitting algorithm to generate fitting curves 618, 620 for determining a first and second signal strength maximum 622,624, which are subsequently used for determining a passing time.

Division of the measured data in first and second data sets may be difficult as the signal strength minimum corresponding may be blurred by noise and/or detecting errors. Hence, due to noise and/or error sources in a conventional system the signal-processing module may e.g. erroneously assign a signal strength data point 626 to the wrong data set. In that case, the signal-processing module may generate fitting curves 618,620, which deviate from the curves which would be generated on the basis of the correct data sets as shown in FIG. 6A. These deviating fitting curves result in an incorrect, or at least inaccurate, determination of the passing time.

Hence, from the above it follows that the phase information may be used to improve the determination of the passing time on the basis of the signal strength data. Further, it allows efficient selection and processing of data sets when compared to conventional systems. These advantages are of particular importance when require accurate and fast time registration.

Figure 7:
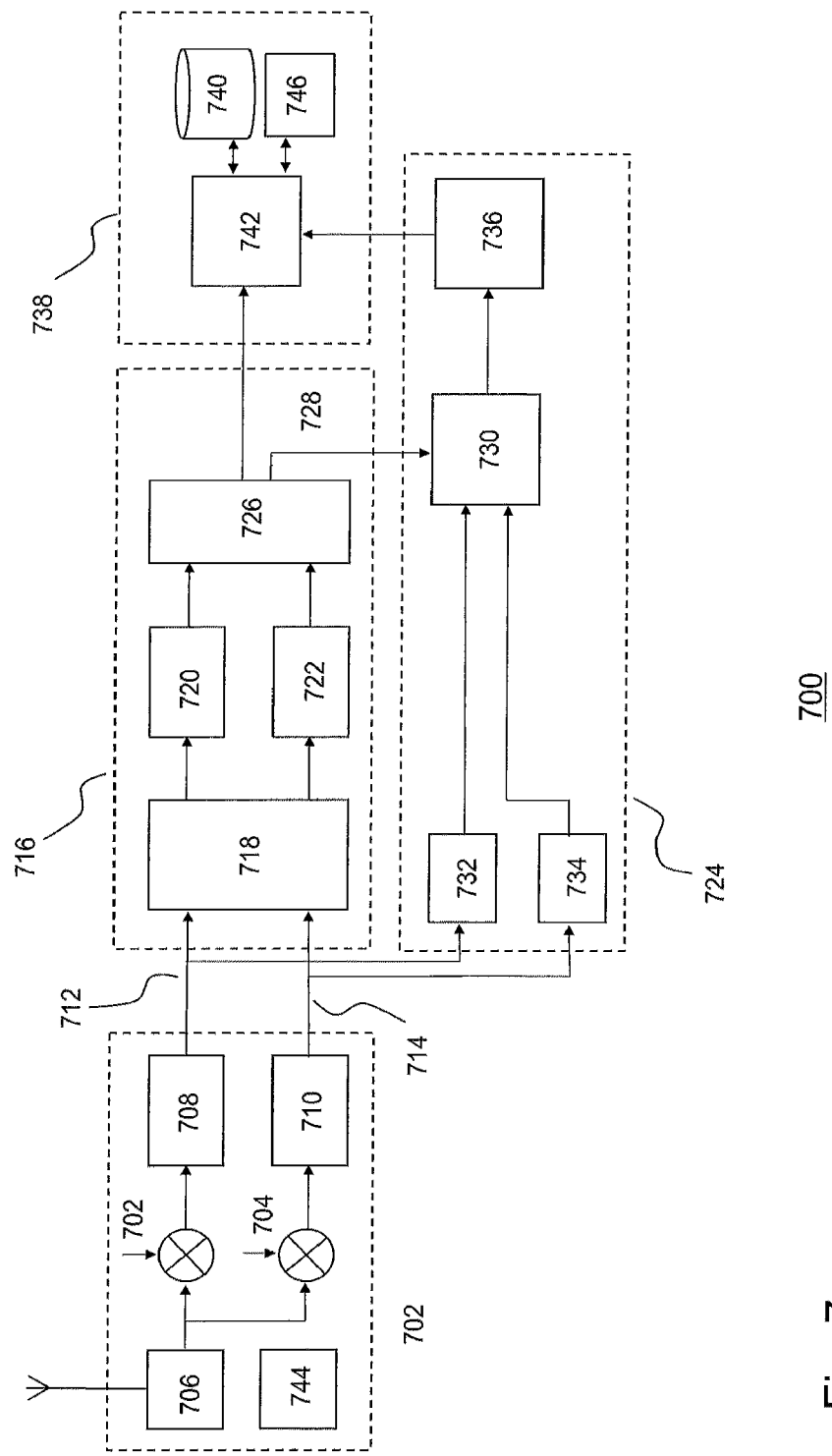
FIG. 7 depicts a timing system according to another embodiment of the invention.

FIG. 7 depicts a detection module according one embodiment of the invention. In particular, FIG. 7 illustrates a detection module 700 implemented on the basis of a digital demodulator scheme for transforming the RF data signal into a digital data packet. The front-end 702 of the detection module may be implemented on the base of the well-known (super)heterodyne receiver principle, comprising e.g. a local oscillator for multiplying an incoming RF signal with a cosine 702 and a sine 704 wave frequency, an analog-to-digital converter (ADC) 706, and low-pass filters 708,710 for producing the in-phase component I 712 and the quadrature component Q 714 of the incoming RF signal.

The I and Q signals are subsequently fed into a transformation module 716 for transforming the I,Q signals into a binary data packet. The transformation module may generate a digital data packet by assigning a binary value, e.g. a 1 or a 0, to sampled I,Q values on the basis of decision logic well known in the art, including a binary phase shift keying (BPSK) circuit 718 and correlators 720,722.

The detection module further comprises phase detection module 724 for determining a phase associated with a detected RF signal. The phase information may be determined on the basis of a predetermined part in the RF signal. For example, in one embodiment, the header (preamble) of the RF signal may be used to determine the phase information. To that end, the transformation module may comprise a binary decision block 726 for detecting a predetermined binary pattern in the data packet corresponding to a data packet header.

If a header of a data packet is detected by the binary decision block, a trigger signal 728 may sent to a sampler 730 for obtaining a sample of the I,Q signals at a predetermined part in the header. This may be realized e.g. by feeding the I,Q signals 712,714 via a delay buffer 732,734 to the sampler. This way, when the trigger signal triggers the sampler, I and Q values are sampled in order to determine the phase at a certain point in the detected signal using the known relation between I,Q and the phase: $\phi=\arctan(I/Q)$. To that end, the sampled I,Q value may be sent to a phase-calculating unit 736 for calculating the phase, which is subsequently forwarded to the signal-processing module 738. This process may be repeated for each detected RF signal.

The detected and transformed data packets may be time-stamped and stored together with the phase information in a cache 740. A processor 742 may monitor the phase information and once a transition is detected it may use the time-stamp information of data packets detected in the vicinity of the phase transition in order to determine a passing time.

In a further embodiment, the detection module may also comprise Received Signal Strength Indicator (RSSI) unit 744 for determining the signal strength associated with a RF data signal. The detection module may associate a measured signal strength to a data packet and send the measured signal strength to the signal-processing module so that the detector module is capable of determining a passing time on the basis of the phase- and signal strength information as described with reference to FIG. 5.

In that case, when the detection module receives RF data signals, the signal strength, phase information and time-stamp information are stored in the cache. Once a phase transition is detected, the processor in the signal-processing module may be triggered to execute a fitting algorithm 746 on the basis data stored in the cache, which are measured before the phase transition.

Figure 8:
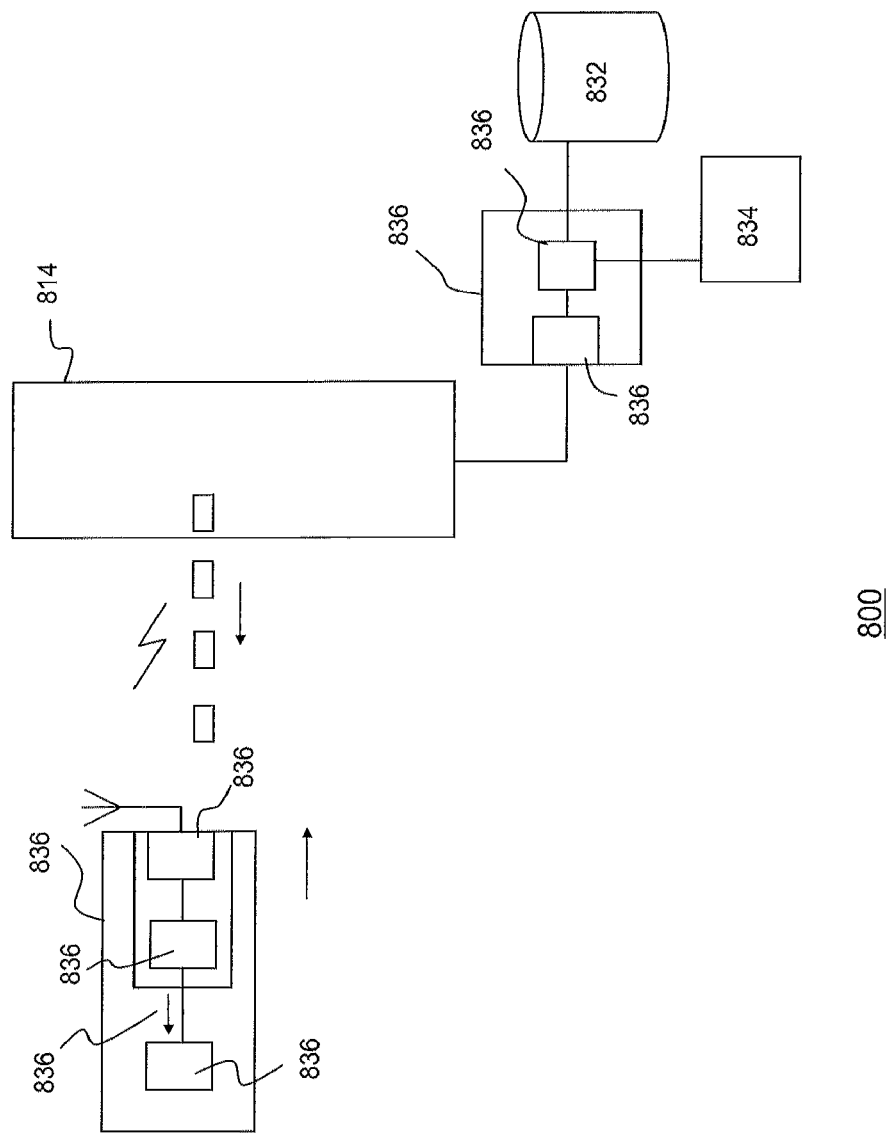
FIG. 8 depicts at least part of a timing system according to another embodiment of the invention.

FIG. 8 depicts a timing system 800 according to another embodiment of the invention. In this embodiment, a participant in an event, e.g. a racing vehicle 801 or the like, may be equipped with a transponder 802 comprising both a transmitter and a detection module as described with reference to FIG. 2-5. In order to provide bi-directional communication between the transponder and the base station, the base station also comprises a transmitter and a detection model.

The transponder may comprise a RF transceiver 804 for transmitting RF signals to the fixed base station 806 which may be detected by the detection module in the base station in a similar way as described with reference to FIG. 2. The base station may be further configured for transmitting data packets via the antenna to the moving transponder. The RF transceiver in the transponder may detect these data packets, which may have a similar structure as described with reference to FIG. 1. When detecting such a sequence of data packets originating from the base station, the detection module 812 in the transponder may start monitoring and processing the phase information associated with these data packets in a similar was described with reference to FIGS. 2 and 3.

Hence, each time the transponder passes the centre-line of an antenna associated with the base station, it will detect a phase transition in the monitored phase information. In this case, the phase transition signal may be used as a very precise trigger signal in timing applications. For example, in car- or motor racing it may be desired to monitor and store a plurality of engine parameters for each consecutive lap. This way, it is possible to precisely analyze the behaviour and the response of an engine for each lap. In such applications, the transponder may further comprise a data interface 814 for communication with a data management module 816 of a vehicle. Upon passing the antenna loop, the detection module may generate a trigger signal 818 which may be used by the data management module as a precise reference time signal indicating the start of a data processing cycle associated with a new lap or a particular location along the track.

Figure 9:
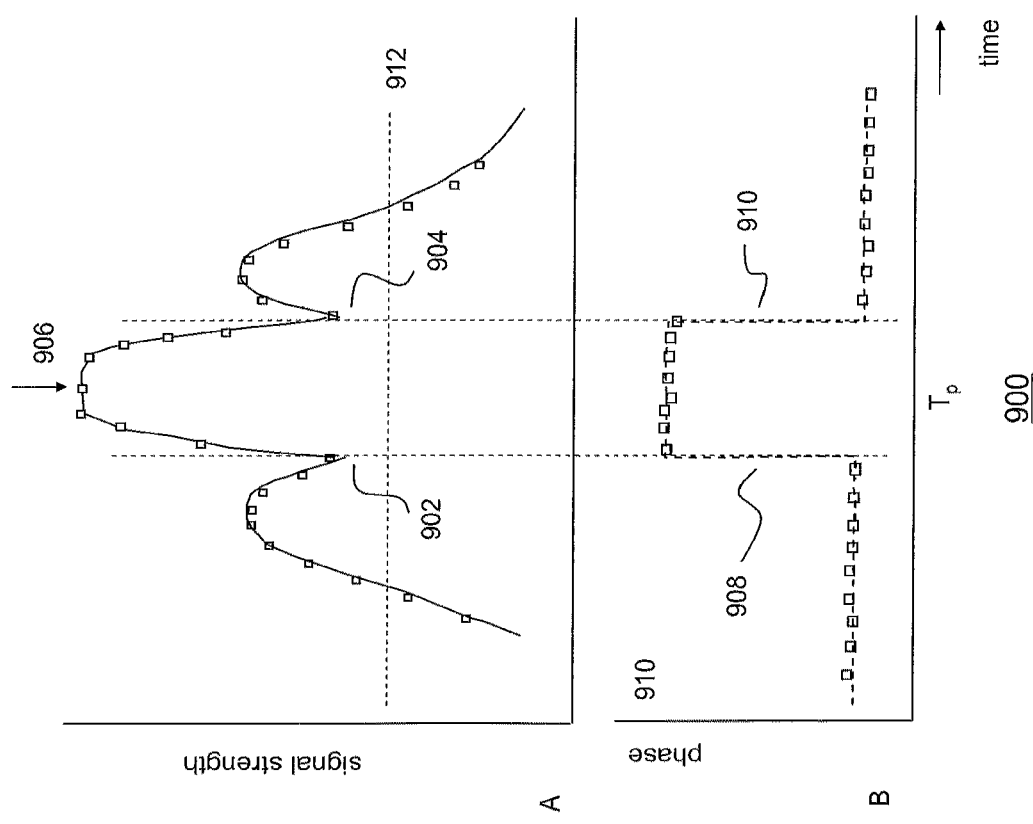
FIG. 9 depicts signal parameters measured by a detecting system according to another embodiment of the invention.

It is to be understood that the invention is not limited to the evaluation of phase and signal strength dependencies as described with reference to FIG. 4. Other antennae configurations will produce different phase and signal strength dependencies. For example, FIGS. 9A and 9B depict signal parameters measured by a detecting system wherein the antenna plane of the signal transmitting device is perpendicular to the plane of the base station antenna. Such configuration may be used in e.g. ice-skating applications. Clearly such configuration exhibits a different signal-strength and phase dependency, wherein sharp minima 902, 904 in the signal-strength are detected at predetermined positions with respect to the base station antenna loop.

Similarly, the phase information exhibits a first and second phase transitions 908, 910 at the minima of the signal strength function. Hence, also in this configuration a detector system may monitor a first and second phase transition, determine on the basis of the time-information associated with data points in the vicinity the phase transitions a first and second time and calculate a passing time therefrom.

It is also to be understood that any feature described in relation to any one embodiment may be used alone, or in combination with other features described, and may also be used in combination with one or more features of any other of the embodiments, or any combination of any other of the embodiments. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Furthermore, equivalents and modifications not described above may also be employed without departing from the scope of the invention, which is defined in the accompanying claims.

The invention claimed is:

1. Method for detecting the passing time of a radio frequency transmitter module passing a detecting module comprising:
   the detecting module receiving one or more signals transmitted by said transmitter module to said detecting module, the one or more signals having an amplitude and a phase;
   determining phase information of the one or more received signals;
   determining time information associated with the one or more received signals;
   detecting at least one phase transition in said phase information, wherein the phase transition is a discontinuous transition from at least a first phase value to a second phase value; and
   determining the passing time of the transmitter module passing the detecting module on the basis of time information of one or more signals associated with the detected discontinuous phase transition.

2. Method according to claim 1 further comprising:
   monitoring at least part of said phase information in time; and
   detecting a transition in said monitored phase information.

3. Method according to claim 1 further comprising:
   determining signal strength information associated with at least part of said detected signals; and
   determining first timing information on the basis of said signal strength information associated with a first set of detected signals measured before said first phase transition.

4. Method according to claim 3 further comprising:
   executing a first algorithm for determining said first timing information when said phase transition is detected.

5. Method according to claim 3, further comprising,
   determining second timing information on the basis of said signal strength information associated with a second set of detected signals measured after said first phase transition.

6. Method according to claim 1, wherein said signals are transmitted using a modulation technique, said method further comprising:
   determining at least an in-phase component I and quadrature component Q associated with a detected signal; and
   determining a detected signal phase on the basis of said I and Q components.

7. Method according to claim 1, wherein at least part of said transmitted signals is associated with a predetermined phase.

8. Method according to claim 1, wherein said passing includes a moving transmitter passing the center-line of an antenna loop associated with a fixed detector.

9. Method according to claim 1, wherein said passing includes a moving detector passing an antenna associated with a transmitter.

10. Detection module for detecting the passing time a radio frequency transmitter module passing the detection module comprising:
    a receiver connected to an antenna for receiving one or more signals transmitted over time by said transmitter module, each of the one or more signals having an amplitude and a phase;

a phase detection module configured to determine phase information associated with at least a part of each of the one or more received signals;

a time stamp module configured to assign time information to each of the one or more received signals;

a signal processor configured to:
  detect at least one phase transition in said phase information, wherein the phase transition is a discontinuous transition of a signal of the one or more signals from at least a first phase value to a second phase value;
  determine the passing time of the transmitter module passing the detecting module on the basis of time information of the signal of the one or more signals associated with the detected discontinuous transition in the signal of the one or more signals.

11. Detection module according to claim 10, wherein said signal processor is configured to monitor at least part of said phase information in time and to detect a phase transition in said monitored phase information.

12. Detection module according to claim 10, further comprising a signal strength measuring unit configured to determine a signal strength associated with a received signal.

13. Detection module according to claim 10, wherein said receiver is configured to generate at least an in-phase component I and quadrature component Q associated with a detected signal and wherein said phase detection module is configured to determine a phase associated with a received signal on the basis of said I and Q components.

14. Transponder comprising a detector module for detecting the passing of a radio frequency transmitter module passing the transponder comprising:
  a receiver connected to an antenna for receiving one or more signals transmitted by said transmitter module, the one or more signals having an amplitude and a phase;
  a phase detection module configured to determine phase information associated with at least a part of the one or more received signals; and,
  a signal processor configured to:
    detect at least one phase transition in said phase information, said phase transition being a discontinuous transition from at least a first phase value to a second phase value; and
    determine a passing between said detection module and said transmitter module on the basis of said detected phase transition; and
  a communications interface operably coupled to the signal processor and configured to communicate with an external vehicle controller and wherein said signal processor is configured to transmit a timing signal to said vehicle controller if said passing is detected on the basis of said phase information.

15. Timing system for detecting the passing time of a radio frequency transmitter module passing a detection module comprising:
  at least one radio frequency transmitter module configured to transmit a plurality of signals; and,
  at least one detection module configured to detect the passing of a transmitter module comprising:
  a receiver connected to an antenna for receiving one or more signals transmitted by said transmitter module, the one or more signals having an amplitude and a phase;
  a phase detection module configured to determine phase information associated with at least a part of the one or more received signals;
  a time stamp module configured to assign time information to the one or more received signal; and,
  a signal processor configured to:
    detect at least one phase transition in said phase information, wherein the phase transition is a discontinuous transition from at least a first phase value to a second phase value;
    determine the passing time of the transmitter module passing the detecting module on the basis of time information of one or more signals associated with the detected discontinuous phase transition.

\* \* \* \* \*